United States Patent
Neilson et al.

(10) Patent No.: US 9,008,515 B2
(45) Date of Patent: Apr. 14, 2015

(54) DIRECT LASER MODULATION

(75) Inventors: David Thomas Neilson, Old Bridge, NJ (US); Pietro Arturo Bernasconi, Aberdeen, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 498 days.

(21) Appl. No.: 13/018,109

(22) Filed: Jan. 31, 2011

(65) Prior Publication Data

US 2012/0087655 A1     Apr. 12, 2012

Related U.S. Application Data (63) Continuation-in-part of application No. 12/945,429, filed on Nov. 12, 2010, now abandoned.

(60) Provisional application No. 61/390,876, filed on Oct. 7, 2010.

(51) Int. Cl.
| | |
|---|---|
| *H04J 14/08* | (2006.01) |
| *H04B 10/12* | (2006.01) |
| *H04J 14/02* | (2006.01) |
| *G02B 5/20* | (2006.01) |
| *G02F 1/23* | (2006.01) |

(Continued)

(52) U.S. Cl.
CPC ............... *H04J 14/0221* (2013.01); *G02B 5/20* (2013.01); *G02F 1/23* (2013.01); *H01S 5/0427* (2013.01); *H04B 10/506* (2013.01)

(58) Field of Classification Search
CPC .......................... H04B 10/504; H04B 10/503
USPC ........................................................ 398/91
See application file for complete search history.

(56) References Cited

U.S. PATENT DOCUMENTS

| | | |
|---|---|---|
| 5,212,745 A | 5/1993 | Miller |
| 5,875,273 A | 2/1999 | Mizrahi et al. |
| 6,034,799 A | 3/2000 | Hansen |

(Continued)

FOREIGN PATENT DOCUMENTS

| | | |
|---|---|---|
| CN | 1224194 C | 10/2005 |
| CN | 101674135 A | 3/2010 |
| WO | WO 2010/028577 A1 | 3/2010 |

OTHER PUBLICATIONS

Patent Abstracts of Japan, Publication No. 2009-033556, published Feb. 12, 2009, 2 pgs.

(Continued)

*Primary Examiner* — Ken Vanderpuye
*Assistant Examiner* — Amritbir Sandhu
(74) *Attorney, Agent, or Firm* — Hitt Gaines, PC (57) ABSTRACT

An apparatus includes an array of lasers, an array of electrical drivers, and optical filter. Each laser is configured to produce light in a corresponding wavelength-channel, wherein the wavelength-channels of different ones of the lasers are different. The electrical drivers are connected to directly modulate the lasers. Each driver produces a first driving current or voltage to cause a corresponding one of the lasers to be in a first lasing state and produces a different second driving current or voltage to cause the corresponding one of the lasers to be in a different second lasing state. The optical filter is connected to receive light output by the lasers. The optical filter selectively attenuates light from each of the lasers in the first lasing states thereof and to selectively pass light from each of the lasers in second lasing states thereof.

24 Claims, 8 Drawing Sheets

(51) Int. Cl.
*H04B 10/50* (2013.01)
*H01S 5/042* (2006.01)

(56) References Cited

U.S. PATENT DOCUMENTS

| | | | |
|---|---|---|---|
| 6,219,172 B1* | 4/2001 | Yariv | 359/264 |
| 6,315,462 B1 | 11/2001 | Anthamatten et al. | |
| 6,498,800 B1* | 12/2002 | Watterson et al. | 372/20 |
| 6,909,536 B1 | 6/2005 | Walker et al. | |
| 7,021,840 B2 | 4/2006 | Kuhara et al. | |
| 7,338,637 B2 | 3/2008 | Pease et al. | |
| 7,489,838 B2 | 2/2009 | Kish, Jr. et al. | |
| 7,515,829 B2* | 4/2009 | Mori | 398/94 |
| 7,889,107 B2* | 2/2011 | Lee | 341/137 |
| 2002/0097471 A1* | 7/2002 | Bethea et al. | 359/172 |
| 2002/0131686 A1* | 9/2002 | Hung | 385/24 |
| 2002/0150323 A1 | 10/2002 | Nishida et al. | |
| 2002/0181519 A1* | 12/2002 | Vilhelmsson et al. | 372/32 |
| 2002/0197010 A1 | 12/2002 | Kato et al. | |
| 2003/0076566 A1* | 4/2003 | Simon et al. | 359/180 |
| 2004/0033004 A1 | 2/2004 | Welch et al. | |
| 2004/0141691 A1 | 7/2004 | Wiesmann et al. | |
| 2005/0058397 A1* | 3/2005 | Doerr | 385/39 |
| 2005/0162658 A1* | 7/2005 | Pepper | 356/451 |
| 2005/0213883 A1 | 9/2005 | Welch et al. | |
| 2008/0107429 A1 | 5/2008 | Galli et al. | |
| 2008/0112445 A1 | 5/2008 | Anselm | |
| 2009/0123165 A1* | 5/2009 | Hashimoto et al. | 398/192 |
| 2009/0214160 A1 | 8/2009 | Arol et al. | |
| 2009/0269069 A1 | 10/2009 | Mahgerefteh et al. | |
| 2009/0310967 A1* | 12/2009 | Wang et al. | 398/69 |
| 2010/0142962 A1* | 6/2010 | Poustie et al. | 398/91 |
| 2010/0234835 A1* | 9/2010 | Horikawa et al. | 606/16 |
| 2011/0103415 A1 | 5/2011 | Rasras | |
| 2011/0158651 A1* | 6/2011 | Tang et al. | 398/98 |
| 2011/0250725 A1 | 10/2011 | Yeh et al. | |
| 2012/0051750 A1* | 3/2012 | Yano | 398/91 |
| 2012/0195593 A1* | 8/2012 | Bernasconi et al. | 398/48 |

OTHER PUBLICATIONS

Japanese Laid-Open Patent Application Publication JP 2009-33556, Feb. 12, 2009, 10 pgs.

PCT International Search Report, PCT/US2011/060359, International Filing Date Nov. 11, 2011, Date of Mailing Apr. 23, 2012, 6 pages.

M. G. Young, et al., "A 16×1 Wavelength Division Multiplexer with Integrated Distributed Bragg Reflector Lasers and Electroabsorption Modulators", IEEE Photonics Technology Letters, vol. 5, No. 8, Aug. 1993, pp. 908-910.

Yiu-Man Wong, et al., Technology Development of a High-Density 32-Channel 16-Gb/s Optical Data Link for Optical Interconnection Applications for the Optoelectronic Technology Consortium (OETC), J. of Lightwave Technology, vol. 13, No. 6, Jun. 1995, pp. 995-1016.

C. R. Doerr, et al, "Monolithic Silicon Coherent Receiver", 2009 OSA/OFC/NFOEC 2009, PDPB2.pdf (2009), 3 pgs.

State Intellectual Property Office of the P.R.C. (SIPO) Search Report, Jan. 8, 2015, 4 pages, with English translation.

* cited by examiner

DIRECT LASER MODULATION

This application is a continuation-in-part of U.S. application Ser. No. 12/945,429, which was filed on Nov. 12, 2010 now abandoned, and also claims the benefit of U.S. provisional application 61/390,876, which was filed on Oct. 7, 2010.

BACKGROUND

1. Technical Field

The inventions relate to apparatus and methods fig optical communication.

2. Discussion of the Related Art

This section introduces aspects that may be helpful to facilitating a better understanding of the inventions. Accordingly, the statements of this section are to be read in this light and are not to be understood as admissions about what is in the prior art or what is not in the prior art.

In optical communication systems, a data stream is modulated onto an optical carrier, which carries the data from an optical transmitter to an optical receiver. One common method of optical data modulation involves amplitude modulation of the optical carrier, e.g., between ON and OFF states. Such optical amplitude modulation of the optical carrier may be performed by direct modulation of the laser that produces the optical carrier, e.g., by changing the biasing of the laser whose output is being modulated. Such optical amplitude modulation of the optical carrier may alternatively be performed by externally modulating the light beam output by a laser, e.g., with a variable optical attenuator.

BRIEF SUMMARY

Various embodiments provide for optically communicating data based on an array of directly modulated lasers. Some such embodiments provide apparatus and/or methods for wavelength-locking an array of directly modulated lasers that produce the data-modulated optical carriers for an optical communications system.

One embodiment of an apparatus includes an array of lasers, an array of electrical drivers, and an optical filter. Each laser is configured to produce light in a corresponding wavelength-channel, wherein the wavelength-channels of different ones of the lasers are different. The electrical drivers are connected to directly modulate the lasers. Each driver produces a first driving current or voltage to cause a corresponding one of the lasers to be in a first lasing state and produces a different second driving current or voltage to cause the corresponding one of the lasers to be in a different second lasing state. The optical filter is connected to receive light output by the lasers. The optical filter selectively attenuates light from each of the lasers in the first lasing states thereof and to selectively passes light from each of the lasers in the second lasing states thereof.

In some embodiments of the above apparatus, the wavelength-channels of the lasers optical filter may have an average wavelength-channel spacing, and the average wavelength-channel spacing is about equal to a positive integer multiple of a free spectral range of the optical filter. The average wavelength-channel spacing may be equal, e.g., to a positive integer multiple of the free spectral range ±10 percent or less of the average wavelength-channel spacing.

In some embodiments of any of the above apparatus, each laser may output light having a first center wavelength in response to being in directly modulated with a first digital data value and may output light having a different second center wavelength in response to being directly modulated with a different second digital data value. In such embodiments, the optical filter may have a response that is at least 2 decibels smaller at each second center wavelength than at the first center wavelength of the same laser.

In some embodiments of any of the above apparatus, the apparatus may further include first and second photo-detectors. The first photo-detector is configured to receive light being output by the lasers and not having passed through the optical filter. The second photo-detector is configured to receive light being output by the lasers and having passed through the optical filter. In some such embodiments, the apparatus may also include a controller configured to adjust output wavelengths of the lasers based on light intensity measurements of the first and second photo-detectors.

In some embodiments of any of the above apparatus, the apparatus may be configured to dither each of the lasers. In some such embodiments, the controller may be configured to adjust an output wavelength of a particular one of the lasers by estimating a light intensity detected by the second photo-detector at a frequency of the dithering of the particular one of the lasers.

In some embodiments of any of the above apparatus, the apparatus may be configured to modulate a corresponding pseudo-random sequence with each of the lasers. In some such embodiments, the controller may also be configured to adjust an output wavelength of a particular one of the lasers by estimating that part of a light intensity detected by the second photo-detector that correlates with the pseudo-random sequence corresponding to the particular one of the lasers.

In some embodiments of any of the above apparatus, the controller may be configured to estimate relative contributions of individual ones of the lasers to the intensity of light measured by the second photo-detector.

In some embodiments of any of the above apparatus, the optical filter may have a free spectral range that is approximately equal to the average wavelength-channel spacing for light output by the array of the lasers ±10 percent or less of the average wavelength-channel spacing.

In some embodiments, a method includes directly modulating a plurality of lasers such that each one of the lasers produces an optical carrier that is modulated to carry digital data in a wavelength-channel corresponding to the one of the lasers. The method also includes forming a multiplexing light beam by optically multiplexing the modulated optical carriers and optically filtering a first portion of the multiplexed light beam with an optical filter having a free spectral range. The wavelength-channels are spaced apart by an average wavelength-channel spacing that is about equal to a positive integer multiple of the free spectral range.

In some embodiments of the above method, each of the directly modulated lasers may lase with a corresponding first center wavelength when transmitting digital data of a first value and lase with a corresponding different second center wavelength when transmitting digital data of a different second value. The optical filtering may attenuate light at the second center wavelength by at least 2 decibels more than light at the first center wavelength.

In some embodiments of any of the above methods, the methods further include splitting the multiplexed light beam in a substantially wavelength-independent manner to form the first portion of the multiplexed light beam and a first part of the multiplexed light beam. In such embodiments, the methods also include measuring an intensity of the first part of multiplexed light without passing the first part through the optical filter and measuring an intensity of a second part of the filtered first portion of the multiplexed light. The second part is produced by splitting the filtered first portion into the second part and another portion of the filtered portion in a substantially wavelength-independent manner. In any such embodiments, the methods may further include adjusting output wavelengths of the lasers based on one or more of the measured intensities. In any such embodiments, the methods may further include dithering output wavelengths of the lasers during the measuring acts. In any such embodiments, the adjusting the output wavelength of each individual one of the lasers may include estimating a contribution to the measured intensity of the second part at the dithering frequency of the individual one of the lasers.

In some embodiments of any of above methods, each directly modulated laser lases with a corresponding first center wavelength when transmitting digital data of a first value and lases with a corresponding second center wavelength when transmitting digital data of a different second value. In such embodiments, the filtering attenuates light at the second center wavelength by at least 2 decibels more than light at the first center wavelength.

In any of the above embodiments of methods, the free spectral range of the optical filter may equal the average wavelength-channel spacing ±10 percent or less of the average wavelength-channel spacing.

BRIEF DESCRIPTION OF THE DRAWINGS

In the Figures and text, like reference symbols indicate elements with similar or the same function and/or structure.

In the Figures, relative dimension(s) of some feature(s) may be exaggerated to more clearly illustrate the feature(s) and/or relation(s) to other feature(s) therein.

Herein, various embodiments are described more fully by the Figures and the Detailed Description of Illustrative Embodiments. Nevertheless, the inventions may be embodied in various forms and are not limited to the embodiments described in the Figures and the Detailed Description of Illustrative Embodiments.

DETAILED DESCRIPTION OF ILLUSTRATIVE EMBODIMENTS

U.S. provisional applications 61/390876, 61/390837, 61/390840, and 61/390798, which were all filed on Oct. 7, 2010; U.S. application Ser. No. 12/944,939, "OPTICAL ASSEMBLY FOR A WDM RECEIVER OR TRANSMITTER", which was filed on Nov. 12, 2010, by David T. Neilson, Nagesh R. Basavanhally, and Mark Earnshaw; U.S. application Ser. 12/944,875, "OPTO-ELECTRONIC ASSEMBLY FOR A LINE CARD", which was filed on Nov. 12, 2010, by Mark Earnshaw; U.S. application Ser. 12/944,917, "OPTICAL TRANSMITTER WITH FLIP-CHIP MOUNTED LASER OR INTEGRATED ARRAYED WAVEGUIDE GRATING WAVELENTH DIVISION MULTIPLEXER", which was filed on Nov. 12, 2010, by Mark Earnshaw and Flavio Pardo; U.S. application Ser. No. 12/944,946, "THERMALLY CONTROLLED SEMICONDUCTOR OPTICAL WAVEGUIDE", which was filed on Nov. 12, 2010, by Mahmoud Rasras; and U.S. application Ser. No. 12/945,550 "WAVELENGTH ALIGINING MULTI-CHANNEL OPTICAL TRANSMITTERS", which was filed on Nov. 12, 2010, by Douglas M. Gill, are all incorporated herein by reference in their entirety. One or more of the above applications may describe optical transmitter structures and/or optical receiver structures; methods of making optical receiver structures and/or optical transmitter structures; and/or methods of using optical receivers, optical transmitters, and components thereof that may be suitable for use in or with, making of, and/or use of embodiments and/or components of embodiments as described herein.

Various embodiments may provide for optical wavelength-locking of or more directly modulated lasers of an array and/or may provide for improving amplitude optical extinction ratio(s) in one or more directly modulated lasers of the array.

Figure 1A:
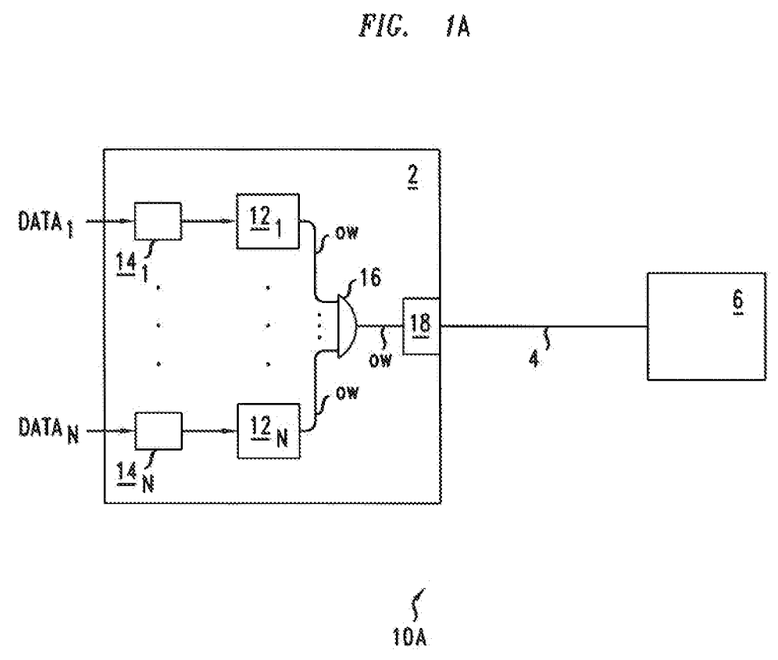
FIGS. 1A, 1B, and 1C schematically illustrate first second and third examples of optical communication systems that directly modulate one or more lasers and optically filter the modulated optical carrier(s) in an optical transmitter, an optical receiver, and an optical channel, respectively.
Figure 1B:
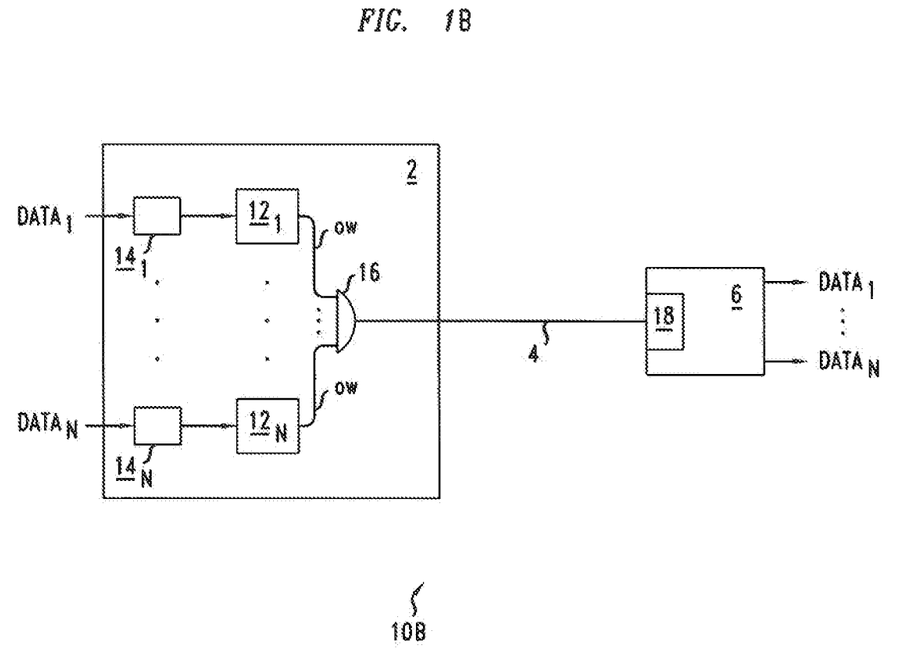
Figure 1C:
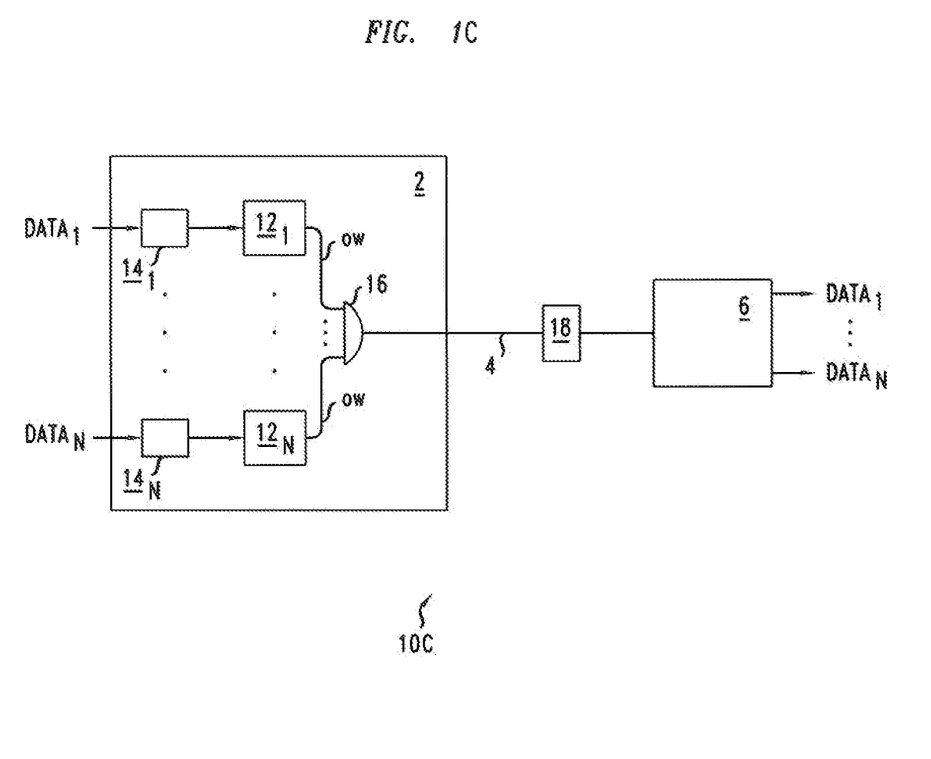

FIGS. 1A-1C schematically illustrate alternate embodiments 10A-10C of optical communication systems 10A that include an optical transmitter 2, an optical transmission channel 4, and an optical receiver 6. The optical transmitter 2 directly modulates digital data onto an optical carrier and transmits the modulated optical carrier to the optical receiver 6 via the optical transmission channel 4. The optical transmission channel 4 may be an optical waveguide; an optical fiber line, an all-optical single-span or multi-span or a non-all optical multi-span line of optical transmission fibers; or a free-space optical channel. The optical receiver 6 processes the received modulated optical carrier and extracts digital data modulated thereon.

Each optical communication system 10A-10C includes an optical communications subsystem that has an array of N laser(s) $12_1, \ldots, 12_N$, an array of N corresponding laser driver(s) $14_1, \ldots, 14_N$, an optical filter 18 and optionally an N×1 optical multiplexer or power combiner 16. Herein, N refers to a positive integer, e.g., N may be 1, 2, 3, 4, 5, 6, 7, 8, 9, 10 or a larger integer.

Each of the N lasers $12_1, \ldots, 12_N$ can output an amplitude and/or frequency modulated optical carrier during direct laser modulation, i.e., light beams as schematically illustrated by arrowed lines in FIGS. 1A-1C. The light of each such optical carrier is typically in a separate wavelength-channel. The wavelength-channels form a sequence of adjacent channels that have an average wavelength-channel spacing (AWCS).

The average wavelength-channel spacing is the actual wavelength-channel spacing if the spacing is wavelength-independent, but otherwise differs from the actual wavelength-channel spacing. Each amplitude and/or frequency modulated optical carrier may carry a sequential data modulation corresponding to a digital data sequence received by the optical transmitter e.g., data sequences $DATA_1$-$DATA_N$ in FIGS. 1A-1C.

Each laser driver $14_1, \ldots, 14_N$ electrically connects to and controls a corresponding laser $12_1, \ldots, 12_N$ of the array. Each laser driver $14_j$ can transform the corresponding laser $12_j$ between a fixed set of lasing states responsive to digital data received by that laser driver $14_j$. The laser driver $14_j$ may transform the lasing states by adjusting a biasing current or voltage or by adjusting a pumping current of the corresponding laser $12_j$. Each fixed set of lasing states includes two or more states, and the laser's output intensity or wavelength or both differ(s) in the different states of the fixed set. Typically, the output intensity, the wavelength, or both differ in the different states of the fixed set as discussed below. Thus, each laser driver $14_j$ directly modulates the corresponding laser $12_j$ to output an optical carrier that is amplitude and/or frequency modulated to carry the digital data sequence $DATA_1$ received by that laser driver $14_j$.

The optional N×1 optical coupler 16 may connect to the optical outputs of the N lasers $12_1$-$12_N$ and deliver light from the lasers $12_1$-$12_N$ to the optical input of the optical filter 18 as a optical wavelength-multiplexed light beam. The N×1 optical multiplexer 16 may be, e.g., a conventional arrayed waveguide optical multiplexer or an optical diffraction grating or a set of thin film optical filters such as dichroic films. The light from the N lasers $12_1$-$12_N$ may alternatively be directed separately to the optical input of the optical filter 18, e.g., via bulk optical device(s) (not shown).

The optical filter 18 receives the amplitude and/or frequency modulated light beams from the lasers $12_1$-$12_N$. The optical filter 18 may be in the optical transmitter 4, the optical receiver 6, or the optical transmission channel 4 as illustrated in FIGS. 1A, 1B, and 1C, respectively.

In some embodiments, the optical filter 18 improves amplitude optical extinction ratio(s) of some or all of the modulated light beams output the lasers $12_1$-$12_N$ of the array, i.e., so that the modulated light beams have an improved amplitude modulation thereon. Indeed, the lasers $12_1$-$12_N$ may produce modulated light beams with undesirably low amplitude optical extinction ratios, e.g., 3-5 decibels (dB), because their amplitude modulation has a low depth during direct laser modulation. The depth of the amplitude modulation maybe kept low in various embodiments so that the lasers $12_1$-$12_N$ do not have operating instabilities when directly modulated at high speeds where a temporal response lag might occur in carrier currents therein. But, a low modulation depth usually implies that a laser will produce a modulated optical carrier whose amplitude extinction ratio is low, which means that the amplitude modulation of the optical carrier has a large DC optical component. Such a large DC optical component can substantially and undesirably lower signal-to-noise ratios at an optical receiver that demodulates data from a received optical carrier based on its amplitude modulation. Such a large DC optical component or equivalently a low amplitude optical extinction ratio could be particularly problematic when the optical receiver is distant: from the optical transmitter transmitting the modulated optical carrier. Thus, in some embodiments of the optical communication systems 10A-10C, it may be desirable to improve amplitude optical extinction ratios of the amplitude and/or frequency modulated optical carriers output by some or all of the N lasers $12_1$-$12_N$.

In addition, some embodiments may be configured to directly modulate some or all the N lasers $12_1$-$12_N$ output frequency modulated optical carriers with low or minimal amplitude modulation. In such embodiments, optical filtering in the optical filter 18 may introduce an amplitude modulation with a suitable amplitude extinction ratio unto such frequency modulated optical carriers.

Figure 2:
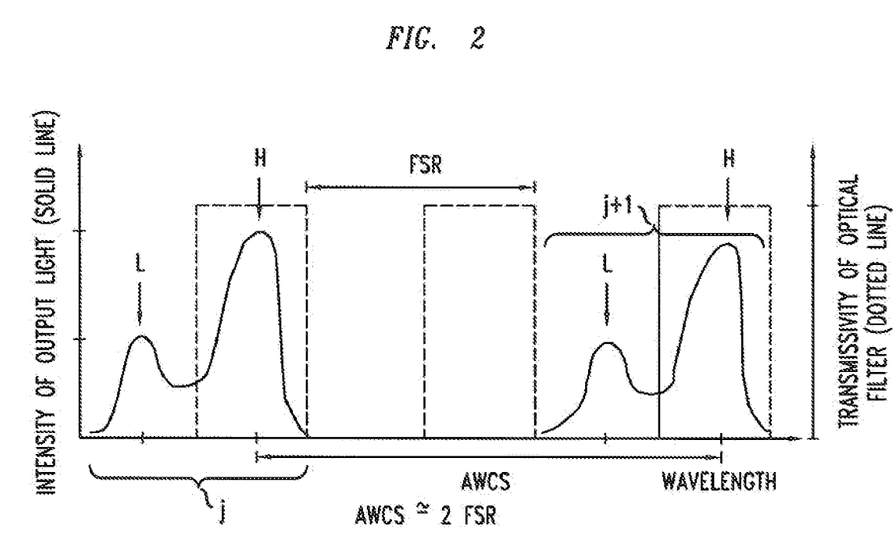
FIG. 2 schematically illustrates an example of an output spectrum of a laser during direct laser modulation and an example of a filter response that might be used to optically filter the output spectrum in an optical communication system or an optical subsystem, e.g., the optical systems of FIGS. 1A-1C and the optical subsystem of FIG. 3.

FIG. 2 schematically illustrates the action of one embodiment of the optical filter 18 of FIGS. 1A-1C. This embodiment of the optical filter 18 may be used to improve amplitude optical extinction ratio(s) in one or more of the amplitude and/or frequency modulated optical carriers output by the lasers $12_1$-$12_N$ of FIGS. 1A-1C and/or may be used to optically wavelength-lock one or more of the N lasers $12_1$-$12_N$ to corresponding predetermined output wavelength channel(s).

FIG. 2 schematically illustrates output spectra of the j-th and (j+1)-th wavelength-channels (solid lines) of two lasers with nearest neighboring wavelength-channels, and the filter response (dashed lines) of the optical filter 18.

In this embodiment, each laser $12_1$-$12_N$ switches between two laser states during direct laser modulation, i.e., a high output intensity state H and a low output intensity state L. In these two states, the laser's optical cavity has slightly different optical path lengths. The different optical path lengths may be caused, e.g., by different carrier densities in the laser's optical cavity and/or may be caused, e.g., by the cavity's electro-optical response to different laser driving voltages. Due to the different optical path lengths, each laser $12_1$-$12_N$ produces light in an H spectral peak while operating in the H state, and outputs light in an L spectral peak of slightly different wavelength while operating in the L state.

As illustrated in FIG. 2, the embodiment of the optical filter 18 has a wavelength-dependent response for which some pass bands are approximately centered on the H peak(s) of the lasers $12_1$-$12_N$. These band passes of the optical filter 18 substantially pass light of the corresponding H peak and strongly attenuate light of the peak L for the same laser $12_1$-$12_N$, because an edge of each of such band pass is located between the corresponding pair of H and L peaks or close to the corresponding pair of H and L peaks. For example, the illustrated embodiments of the optical filter 18 may increase a ratio of the intensity of the H peak over the intensity of the L peak of the same laser $12_1$-$12_N$ by 2 dB or more or by 4 dB or more. Thus, the optical filter 18 can improve the amplitude optical extinction ratio by making the corresponding pair of H and L lasing states closer to optical ON and OFF keying states even if the direct laser modulation is not too deep.

In some embodiments, the optical filter 18 is configured substantially pass each H peak of the N directly modulated lasers $12_1$-$12_N$ and to substantially blocks each L peak thereof.

Such a configuration may be achieved by if the average wavelength-channel spacing (AWCS) of the wavelength-channels is about an integer multiple of the free spectral range (FSR) of the optical filter 18. For example, AWCS may be equal to FSR, 2FSR, 3FSR, etc., up to a small error. The size of the small error between the value of the AWCS and the relevant integer multiple of the FSR limits the maximum size of the array, but the error would typically, at least, be less than 10 percent of the AWCS. If the FSR and AWCS satisfy one of the above relations and output spectra of the N lasers $12_1$-$12_N$ have similar shapes up to overall translations, then, if the optical filter 18 substantially passes the H peak and strongly relatively attenuates the L peak of the laser $12_j$, the optical filter 18 can substantially pass the H peaks and strongly attenuate the L peaks of the amplitude and/or frequency modulated optical carriers output by the other directly modulated lasers $12_1$-$12_N$.

Alternatively, the lasers $12_1$-$12_N$ may be fixed or tunable to a non uniform grid for which the spacings between neighboring grid wavelengths are set to be approximately positive integer multiples of the FSR of the optical filter 18, e.g., the spacings may be FSR, 2FSR, 3FSR, etc. For example, spacings between neighboring grid wavelengths may differ from such positive integer multiples of the FSR by less than 10 percent of the positive multiple.

Figure 3:
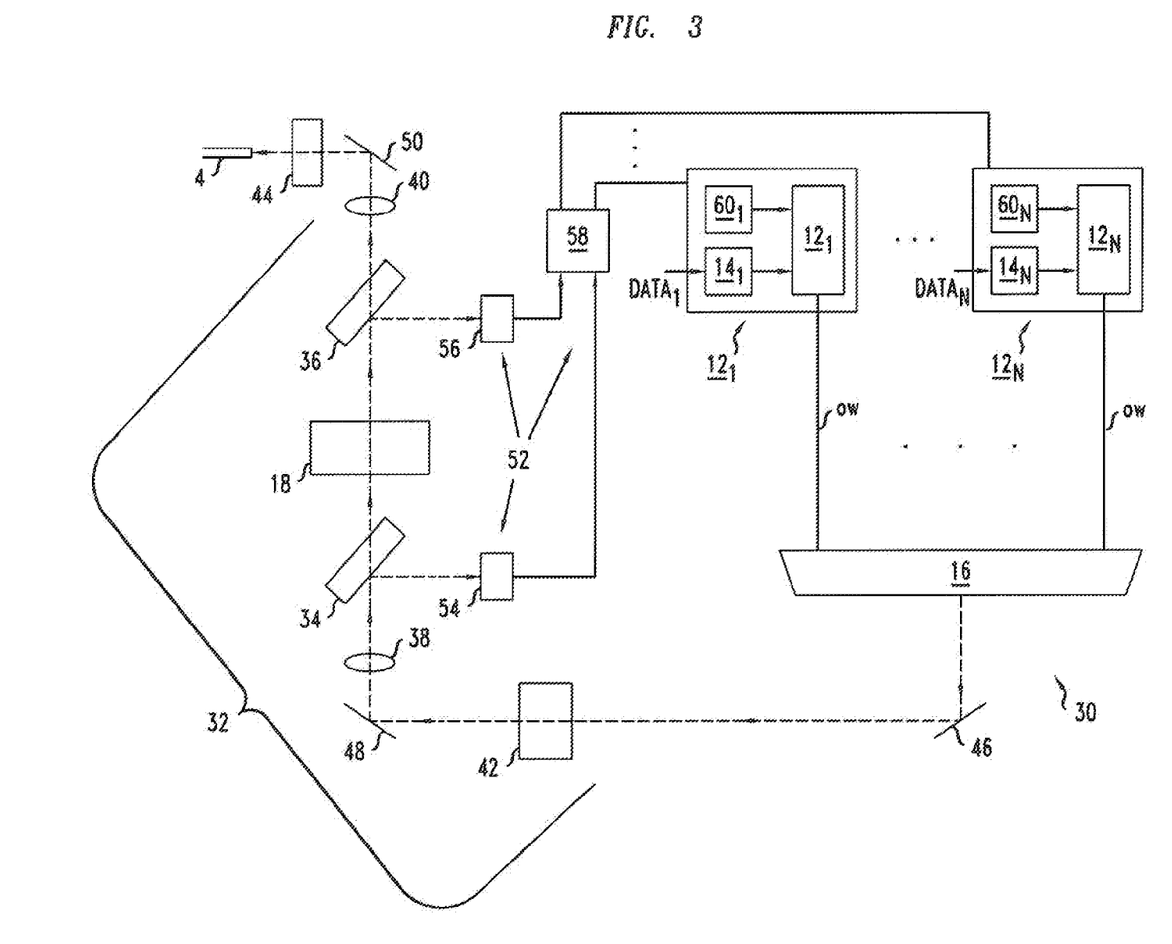
FIG. 3 schematically illustrates an optical subsystem with an optical filter, e.g., used to improve amplitude optical extinction ratio(s) and/or perform wavelength-channel locking, e.g., in any of the optical communication systems of FIGS. 1A-1C.

FIG. 3 illustrates an example of a subsystem 30 in which N lasers $12_1$-$12_N$ are directly modulated to transmit digital data, in parallel, to a sequence of N corresponding optical channels, e.g., in the optical transmitter 2 of FIG. 1A. The subsystem 30 includes an optical multiplexer 16 that combines the light output by the N lasers $12_1$-$12_N$, a optical sequence 32 that treats and/or aids to monitor the multiplexed output light, and in some embodiments, a monitoring an adjustment system 52.

The optical sequence 32 transmits a portion of the multiplexed output light, i.e., as indicated by a dashed line, from the optical multiplexer 18 to the transmission optical fiber 4 of FIG. 1A. In some embodiments, the optical sequence 32 also may transmit parts of the multiplexed output light to the monitoring and adjustment system 52.

The optical sequence 32 includes an optical filter 18 and may include one or more other bulk or integrated conventional optical elements, e.g., a tree space sequence of bulk optical components. The other optical elements may include one or more optical beam splitters 34, 36; one or more relay lenses 38, 40; one or more optical isolators 42, 44; and one or more turning mirrors 46, 48, 50. The optical filter 18 may be, e.g., a Fabry-Pérot etalon for which a positive integer multiple of the free spectral range is about equal to the average wavelength-channel spacing (AWCS) for the N lasers $12_1$-$12_N$ of the array, e.g., up to ±10 percent or less of the AWCS. The filter may be a single or multi cavity filter, e.g., a multi-cavity optical etalon, which creates a desired filtering profile. The optional first and second optical beam splitters 34 and 36 split off first and second parts of the multiplexed light beam prior to and after filtering by the optical filter 18, respectively. The optical beam splitters 34 and 36 are not significantly wavelength-dependent over the spectrum of N lasers $12_1$-$12_N$, e.g., the splitting may be power or polarization. The optical beam splitters 34 and 36 direct first and second parts of the optically multiplexed light beam to the monitoring and adjusting system 52. The relay lenses 38, 40 may aid to reduce losses due to diffraction and ease the alignment of light beams through the optical system. The relay lenses 38, 40 may also provide optimal beam sizes for the optical filter 18 to ensure correct filter shape and low loss optical losses therein. The relay lenses 38, 40 are also configured to reduce optical path length differences for different portions of the optically multiplexed light beam in the optical filter 18. The optical isolators 42 and 44 reduce optical feedback to the N lasers $12_1$ $12_N$ and to the monitoring and adjusting system 52, respectively. The turning mirrors 46, 48, 50 may aid to shape or reduce linear dimension(s) of the footprint of the subsystem 32.

The monitoring and adjusting system 52 includes first and second photo-intensity detectors 54 and 56, photo-diodes, and an electronic controller 58. The first photo-detector 54 makes a measurement indicative of the intensity of the multiplexed light beam prior to filtering in the optical filter 18. The second photo-detector 56 makes a measurement indicative of the intensity of the multiplexed light beam after filtering in the optical filter 18. The controller 58 is connected by electrical lines to receive the measurements from the photo-intensity detectors 54, 56 and is connected by electrical lines to enable adjustment of the output wavelengths of the N lasers $12_1$-$12_N$ of the array based on the measured light intensities. For example, the electronic controller 58 may separately control the temperature of the optical cavities of each of the N lasers $12_1$-$12_N$, e.g., via currents to individual heaters of the lasers $12_1$-$12_N$ (not shown). Thus, the controller 58 controls and can adjust the output wavelengths of the N lasers $12_1$-$12_N$.

In the subsystem 32, each of the N lasers $12_1$-$12_N$ may optionally include a driver $60_1$-$60_N$ that is configured to dither the output frequency of the corresponding laser $12_1$-$12_N$. For example, the dithering frequencies may be in the range of about 1 to 10 kilo-Hertz (kHz), about 10-100 kHz, or about 100-1,000 kHz. The j-th driver $60_j$ may dither the output frequency of the j-th laser 12, at a frequency that is different than the frequency that the k-th driver $60_k$ dithers the k-th laser $12_k$ for all k ≠ j. For that reason, the contributions of individual ones the N lasers $12_1$-$12_N$ to the multiplexed light beam from the optical multiplexer 16 may be identified by the corresponding dithering frequencies.

While the dithering on each laser is described herein as being performed at a single frequency, alternate embodiments may use other types of frequency dithering. For example, the frequency dithering may use spread spectrum techniques in which each lasers $12_1$-$12_N$ would be dithered over a band of frequencies, e.g., as in code-division multiple access (CDMA). In light of the present disclosure, persons of ordinary skill in the relevant Arts would readily understand that such alternate forms of frequency dithering would also provide techniques that enable distinguishing the contributions of individual ones of the N lasers $12_1$-$12_N$ to the multiplexed light beam and to the portion of the multiplexed beam filtered by the optical filter 18.

In particular, the electronic controller 58 may accumulate measurements of the photo-detectors 54, 56 over a sampling period. The sampling period is typically long compared to the period for transmitting one data symbol on an wavelength-channel and is typically short compared to the time over which the output optical wavelengths of any of the lasers $12_1$-$12_N$ are expected to change significantly. For each sampling period, the electronic controller 58 can determine a contribution an individual one of the lasers $12_1$-$12_N$ to the intensities measured by the photo-detectors 54, 56 by evaluating Fourier coefficients of the measurements at the dithering frequency of the individual one of the lasers $12_1$-$12_N$. Based on the values of the contributions, the electronic controller 56 can determine how to change the output optical wavelength of the individual one of the lasers $12_1$-$12_N$, e.g., so that the output optical wavelength of the individual ones of the lasers $12_1$-$12_N$ are approximately wavelength-locked to be at about the AWCS from the nearest output optical wavelength(s) of other(s) of the lasers $12_1$-$12_N$ of the array.

At a dithering frequency, the ratio of the contribution to the part of the multiplexed light beam measured in the photo-detector 56 over the contribution to the part of the multiplexed light beam, as measured in the photo-detector 54, is often roughly maximized when a pass band of the optical filter 18 is about centered on 11 peak of the corresponding one of the lasers $12_1$-$12_N$. Such a maximization will typically occur if the pass band of the optical filter 18 has 3 dB width that is equal to or less that the 3 dB width of H peak. Then, the optical filter 18 can substantially pass the H peak and simultaneously substantially attenuate the corresponding L peak when centered at about the center wavelength of the H peak.

Alternate embodiments of the subsystem 30 of FIG. 3 may use alternate ways to distinguish the intensity contributions of the individual lasers $12_1$-$12_N$ in the optically multiplexed light beam and the filtered portion thereof. For example, the subsystem 30 may be configured to modulate each individual laser $12_1$-$12_N$ with a corresponding and distinct pseudo-random sequence of digital data. Then, the different pseudo-random sequences of digital data may be used to identify contributions of individual ones of the lasers $12_1$-$12_N$. In particular, the electronic controller 58 may use those parts of the measured light intensities that temporally correlate with one of the pseudo-random sequences of digital data as a measure of the contributions of the one of the lasers $12_1$-$12_N$ that transmits that particular pseudo random sequence. Indeed, any adjustment of an output wavelength of that one of the lasers may be based on the estimates of the part(s) of light intensities detected by the photo-detectors 54, 56 that temporally correlate with that particular pseudo-random sequence.

Figure 4:
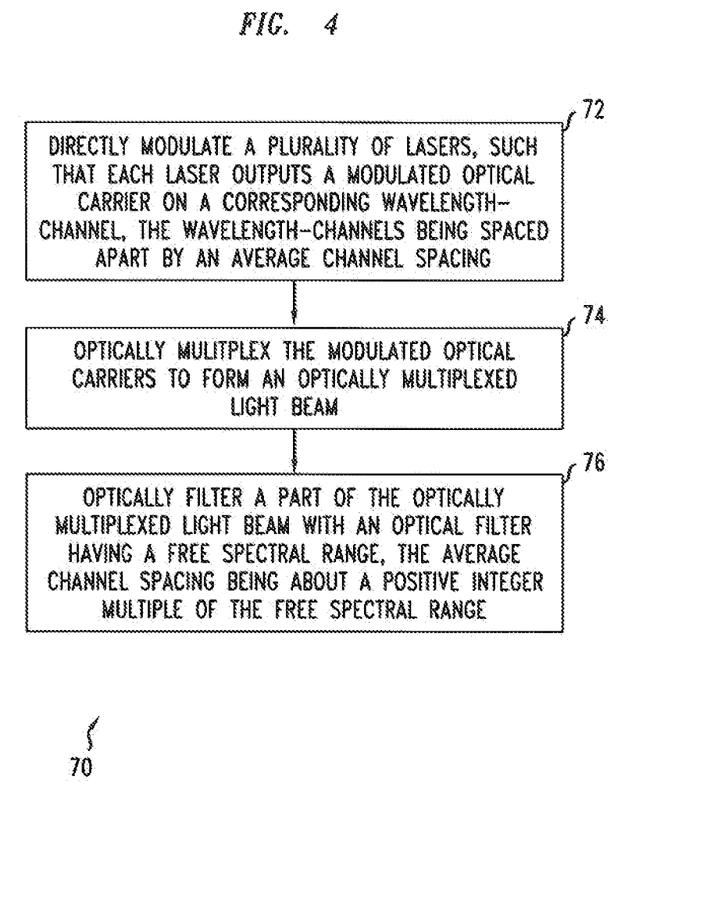
FIG. 4 is a flow chart illustrating a method of processing light output by one or more directly modulated laser(s) of an array, e.g., to improve amplitude optical extinction ratio(s), e.g., in the systems and subsystems of any of FIGS. 1A, 1B, 1C, and 3.

FIG. 4 illustrates a method 70 of operating an array of N lasers to optically transmit digital data, e.g., the lasers $12_1$-$12_N$ in FIGS. 1A, 1B, 1C, and/or 3. Here, the integer N is greater than or equal to one, e.g., N may be 1, 2, 3, 4, 5, 6t, 7, 8, 9, 10 or more.

The method 70 includes directly modulating a plurality of lasers such that each laser of the plurality outputs an amplitude and/or frequency modulated light beam on a corresponding wavelength-channel (step 72). The wavelength-channels of the different lasers are spaced apart by an average wavelength-channel spacing. The various wavelength-channels may or may not be spaced apart by an approximately wavelength-independent spacing. The direct modulating generates optical carriers that carry streams of digital data, e.g., each optical carrier may be modulated by a different stream of received digital data. For example, the drivers $14_1$-$14_N$ of FIGS. 1A-1C and/or 3 drive the lasers $12_1$-$12_N$ to output optical carriers that are amplitude and/or frequency modulated by digital data streams $DATA_1$-$DATA_N$. The amplitude and/or frequency modulation of the Optical carriers may correspond approximately, in some embodiments, to optical ON/OFF keying, or may correspond to an amplitude and/or frequency modulation protocol with more than two symbol values.

The method 70 includes optically multiplexing the amplitude and/or frequency modulated optical carriers that are output by the lasers to form an optically multiplexed light beam (step 74). The optical multiplexing may be performed by the N×1 optical multiplexer 16 of FIGS. 1A, 1B, 1C, and/or 3, e.g., which may receive the amplitude and/or frequency modulated optical carriers via optical waveguides (OW).

The method 70 includes optically filtering the optically multiplexed light beam in an optical filter, e.g., the optical filter 18 of FIGS. 1A, 1B, 1C, and/or 3 (step 76). The optical filter has a free spectral range (FSR). The average wavelength-channel spacing is approximately an integer multiple of the free spectral range of the optical filter. For example, the average wavelength-channel spacing may differ from such an integer multiple of the free spectral range by less than about 10 percent of the average wavelength-channel spacing. Then, if the optical filtering of step 76 improves an amplitude optical extinction ratio for one of the wavelength-channels, the optical filtering can also improve the amplitude optical extinction ratio for the other(s) of the N optical channels, i.e., if the spectral intensity peaks are similarly distributed in each of the wavelength-channels.

The optical filtering of the step 76 typically more strongly attenuates one spectral peak each of the directly modulated lasers, e.g., the L peak of FIG. 2, than the other spectral peak(s), e.g., the H peak of FIG. 2, of the same one of the directly modulated lasers. For example, the low intensity spectral peaks may be typically more strongly attenuated by 2 dB or more than the corresponding H peaks or may be more strongly attenuated by 4 dB or more than the corresponding H peaks. In such embodiments, the optical filtering of the step 76 improves the amplitude optical extinction ratio of the amplitude and/or frequency modulated optical carriers output by the directly modulated lasers.

Figure 5:
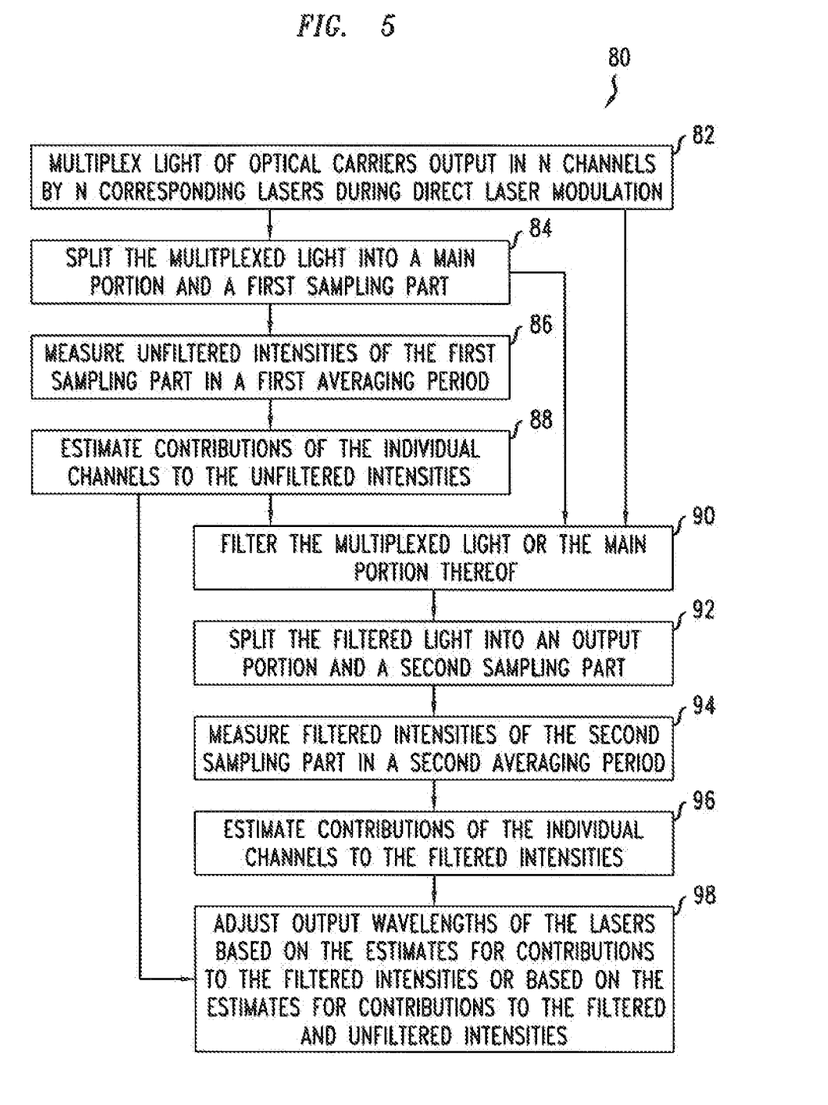
FIG. 5 is a flow chart illustrating a method of adjusting the output wavelengths of any array of directly modulated lasers, e.g., in the systems and subsystems of any of FIGS. 1A, 1B, 1C, and 3, e.g., to implement wavelength-locking.

FIG. 5 illustrates a method 80 of wavelength-locking an array of directly laser modulated lasers, e.g., the N lasers $12_1$-$12_N$ illustrated in FIGS. 1A, 1B, 1C, and/or 3.

The method 80 includes optically multiplexing the N amplitude and/or frequency and/or frequency modulated optical carriers output by N corresponding lasers during direct laser modulation of digital data thereby, e.g., using the optical multiplexer 16 of FIGS. 1A-1C and/or FIG. 3 (step 82). The N amplitude and/or frequency modulated optical carriers are output, in parallel, on different wavelength-channels. Thus, the optical multiplexing produces an optically multiplexed light beam with the amplitude and/or frequency modulated optical carriers in N different optical wavelength channels.

The method 80 may optionally include frequency-dithering the output optical wavelength of each of the N lasers during the direct laser modulation thereof. For example, the dithering may be done with the drivers $60_1$-$60_N$ of FIG. 3. The frequency-dithering the N lasers may be performed in series or in parallel. If the frequency-dithering is performed in parallel, each one of the N lasers will typically have a different dithering frequency than the other(s) of the N lasers. The individual dithering frequencies may be, e.g., one of the ranges 10 kHz to 10 kHz; 10 kHz to 1,000 kHz; 1,000 kHz to 1 MHz; etc.

The method 80 optionally includes optically splitting the multiplexed light beam into a main portion and a first sampling part, e.g., in optical beam splitter 34 of FIG. 3 (step 84). The optical splitting directs the main portion towards an optical filter, e.g., the optical filter 18 of FIGS. 1A-1C and 3, and directs the sampling part towards an optical intensity detector, e.g., photo-detector 54 of FIG. 3. The optical splitting is performed in a substantially wavelength-independent manner so that intensities of individual wavelength-channels in the first sampling part are indicative of relative intensities of those wavelength-channels in the original optically multiplexed light beam. For example, the optical splitting may involve splitting the optically multiplexed light beam with a polarization splitter or an optical power splitter to provide for such substantial wavelength-independence.

In embodiments including the optional optical splitting of step 84, the method 80 also includes electronically measuring optical intensities of the first sampling part of the optically multiplexed light beam, i.e., an unfiltered part, at a set of times in a first temporal averaging period, e.g., in the photo-detector 54 of FIG. 3 (step 86). The first temporal averaging period is preferably short compared to times over which output wavelengths of the lasers are expected to substantially change and is typically long compared to the period for transmitting an optical symbol on one of the amplitude and/or frequency modulated optical carriers, e.g., the period may be one to a few milliseconds. The intensities measured at the sequence of times may be sent, e.g., to the electronic controller 58 of FIG. 3 for further processing.

In embodiments including optional optical splitting of step 84, the method 80 also includes electronically estimating relative contributions of light in individual ones of the wavelength-channels to the intensities of the first sampling part measured at the set of times in the first temporal averaging period, e.g., in the electronic controller 58 of FIG. 3 (step 88). The estimating step 88 estimates the contributions of individual ones of the N lasers to the measured intensities and may be performed in a serial manner or in a parallel manner.

In a serial embodiment, the estimating of step 88 may involve sequentially varying the amplitude and/or frequency of the light output by individual ones of the N lasers or sequentially frequency-dithering individual ones of the N lasers to determine the individual contribution of the laser-being-varied to the measured optical intensities.

In a parallel embodiment, the estimating step 88 may involve frequency-dithering the N lasers, in parallel, where each of the lasers is dithered at a different frequency than the other(s) of the lasers. In such an embodiment, the dithering frequency can be used to identify the contribution of individual ones of the N lasers. Then, the estimating step 90 may involve, e.g., evaluating Fourier coefficients of Fourier components of the intensities measured in the first sampling part at the dithering frequencies of the N lasers. Such Fourier coefficients can be obtained by making weighted averages over the intensities measured at the set of times of the first temporal averaging period. Indeed, the Fourier coefficient of the measured intensities for a particular frequency is one estimate of the relative contribution of the laser, which was dithered at that frequency, to the intensities measured for the first sampling part in the first temporal averaging period. If the spectral response of the filter at step 84 is known, comparing a Fourier component before and after filtering by the filter can enable a determination of the relative position of the wavelength of the laser emitting said Fourier component.

The method 80 includes optically filtering the multiplexed light beam in an optical filter or optically filtering the main portion of the multiplexed light beam in embodiments where the optical splitting step 84 is performed (step 90). The optical filter may be, e.g., optical filter 18 of FIG. 3. The average wavelength-channel spacing (ACS) of the wavelength-channels may be about equal to a positive integer multiple of the free spectral range (FSR) of the optical filter, e.g., up to an error of ±10 percent or less of the ACS. For such a free spectral range, the optical filtering of step 90 can improve amplitude optical extinction ratios of each of the N amplitude and/or frequency modulated optical carriers provided that the optical filtering improves the amplitude optical extinction ratio of one of the amplitude and/or frequency modulated optical carriers and that the distribution of light intensity has a similar shape in the different wavelength-channels. For such a free spectral range, the optical filtering step 90 can also provide feedback that useable for wavelength-locking each of the N lasers if the optical filtering again provides feedback usable to wavelength-lock one of the N lasers and the distribution of light intensity has a similar shape in the different wavelength-channels.

The method 80 includes optically splitting the optically filtered multiplexed light beam or the optically filtered main portion thereof into an output portion and a second sampling part, e.g., in optical beam splitter 56 of FIG. 3 (step 92). The optical splitting step 92 is also performed in a substantially wavelength-independent manner so that the contribution of each wavelength-channel to the intensity of the second sampling part is indicative of the relative intensity of the individual wavelength-channel in the optically filtered multiplexed light beam or the optically filtered main portion thereof. For example, the optical splitting of step 92 may be performed with a polarization splitter or an optical power splitter to provide for such substantial wavelength-independence.

This optical splitting step 92 typically directs the output portion of the filtered Multiplexed light beam or the filtered main portion thereof towards an optical transmission channel. In the system 10A of FIG. 1A, the output portion may be transmitted directly or indirectly to the optical transmission channel 4. In the subsystem 30 of FIG. 3, the output portion is further processed by the part of the optical sequence 32 formed by the relay lens 40, mirror 50, and isolator 44 and is then, transmitted to the optical transmission channel 4.

This optical splitting step 92 typically directs the second sampling part to a second optical intensity detector, e.g., photo-intensity detector 56 of FIG. 3. Alternatively, rather than performing the optically splitting step 92 to produce the second sampling portion, a reflected portion of the multiplexed light beam from the filter may be used to form the second sampling portion, directed towards the second optical intensity detector.

The method 80 includes electronically measuring optical intensities of the second sampling part of the filtered multiplexed light beam or the filtered main portion of the multiplexed light beam at a sequence of times in a second temporal averaging period, e.g., with the photo-detector 54 of FIG. 3 (step 94). The second temporal averaging period is again preferably short compared to the time over which output wavelength(s) of the N lasers are expected to substantially change and is typically long compared to a period for transmitting an optical symbol on one of the amplitude and/or frequency modulated optical carriers. The second temporal averaging period may be equal to or about equal to the first temporal averaging period. The intensities measured at the sequence of times of the second temporal averaging period may again be sent to the electronic controller 58 of FIG. 3.

The method 80 includes electronically estimating relative contributions of the individual wavelength-channels to the intensities of the second sampling part measured at the times of the second temporal averaging period, e.g., in the electronic controller 58 of FIG. 3 (step 96). The estimating of step 96 involves estimating the contributions of individual ones of the lasers to the measured intensities and may be performed in a serial manner or in a parallel-manner. The serial and parallel embodiments of step 96 may be similar or identical to respective serial and parallel embodiments described with respect to the estimating step 88 except that the processing is performed on measurements of the second sampling part during the second temporal averaging period rather than on measurements of the first sampling part during the first temporal averaging period. For example, an estimate for the contribution of a wavelength-channel to the second sampling part may be taken as the Fourier coefficient for the Fourier component whose frequency is the dithering frequency of the laser that outputs an amplitude and/or frequency modulated carrier in that wavelength-channel.

The method 80 includes adjusting the output wavelengths of the individual lasers based on the estimates for the relative contributions of the individual lasers to the measured intensities of the second sampling part of the filtered portion of multiplexed light beam as determined at above step 96 (step 98). The adjusting step 98 may optionally also be based on the estimates of the step 88 for relative contributions of said individual lasers to the measured intensities of the first sampling part of the multiplexed light beam, i.e., the unfiltered part, as determined at above step 88. The adjusting step 98 may be controlled, e.g., by the controller 58 of FIG. 3, and the output wavelength adjustments may be implemented by the adjustment of individual heaters (not shown in FIG. 3) for the N lasers by the controller 58. In some embodiments, the adjusting step 98 involves adjusting the output wavelengths of the N lasers to lie on a preselected grid of wavelength-channels, e.g., a grid in which neighboring channels are separated by a fixed or wavelength-independent spacing, e.g., about equal to the average wavelength-channel spacing (AWCS).

In some embodiments, the estimated intensity contribution of a laser to the measured intensities of the second sampling part of the filtered light, as determined at step 96, is used itself to determine how to vary the output wavelength of that laser. For example, the output wavelength maybe adjusted to iteratively maximize the estimated value for this contribution.

In other embodiments, a ratio of the estimated contribution of the laser to the measured intensities of the second sampling part of the filtered light, as determined at step 96, over the estimated contribution of the same laser to the measured intensities of the first sampling part of the unfiltered light, as determined at step 88, is used to determine how to vary the output wavelength of that laser. For example, the output wavelength of that laser may be adjusted iteratively to maximize this ratio. As discussed above, both contributions for this laser may be obtained as Fourier coefficients for Fourier components of the measured intensities of the first and second sampling parts at the dithering frequency of that laser.

Figure 6A:
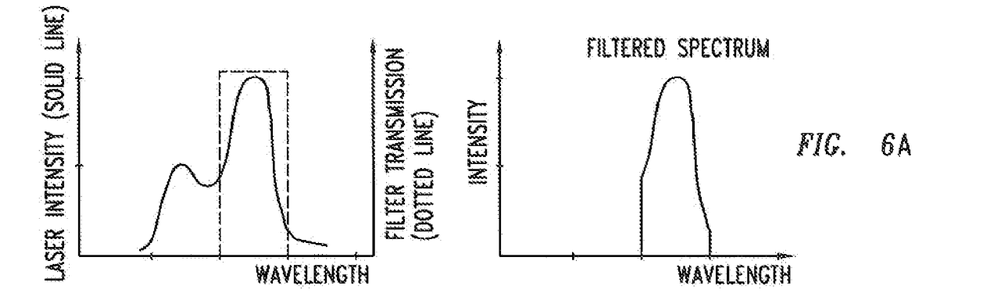
FIGS. 6A-6C schematically illustrate how the intensity of an amplitude and/or frequency and/or frequency modulated optical carrier from a directly modulated laser may change due to filtering with an optical filters having different alignments with respect to the major spectral peak in the laser's output spectrum, e.g., in the systems and subsystem of any of FIGS. 1A, 1B, 1C and 3.
Figure 6B:
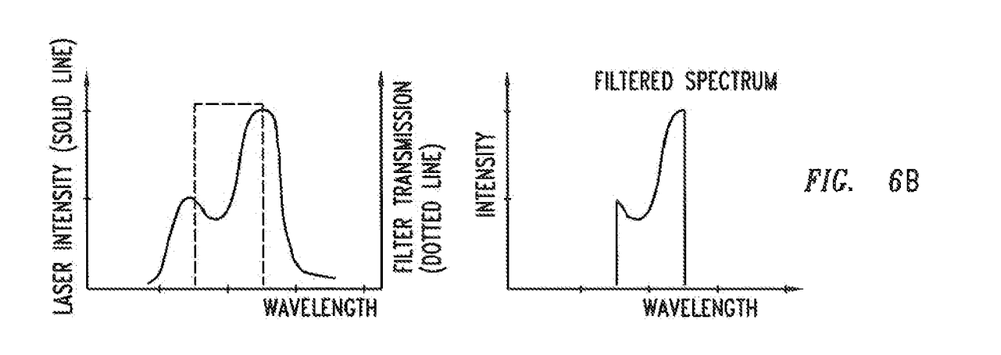
Figure 6C:
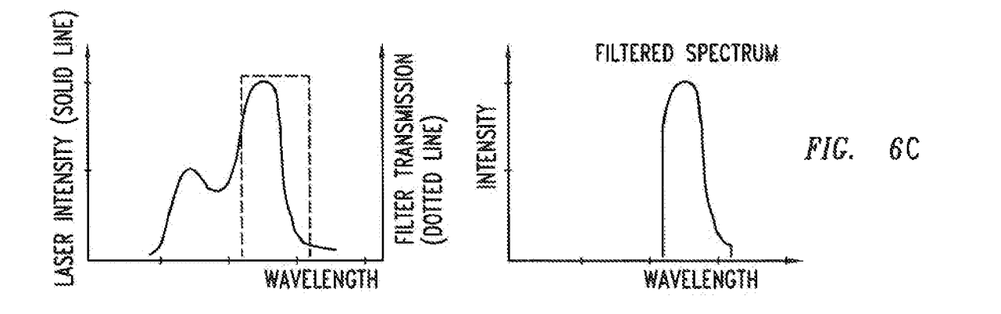

FIGS. 6A-6C illustrate how a laser's contribution to the measured intensities of the second sampling part during direct modulation, as estimated at step 96, and the ratio of said contribution to the same laser's contribution to the measured intensities of the first sampling part during direct modulation, as estimated at step 88, can be use to determine the output wavelength of the laser. In FIGS. 6A-6C, the optical filter performing optical filtering step 90 has a band pass that is about as wide as the H spectral peak in the laser's output spectrum. For this optical filter, the laser's contribution to the intensity of the multiplexed light beam after the optical filtering is strongly dependent to the spectral locations of the band passes of the optical filter and the spectral location of the H and L peaks of the laser.

FIGS. 6A, 6B, and 6C indicate configurations in which the optical filter of the step 90 has a rectangular band pass that is:
A) centered on the center wavelength of the H peak of the laser during direct modulation,
B) centered at a wavelength slight shorter than the center wavelength of the H peak of the laser during direct modulation, and
C) centered at a wavelength that is slight longer than the center wavelength of the H peak of the laser during direct modulation, respectively.

The left portions of FIGS. 6A-6C illustrate the band pass (dotted lines) of the optical filter of step 90 and the output spectrum of the laser (solid lines) for these configurations. The right portions of FIGS. 6A-6C illustrate the wavelength-dependent intensity of the spectrum after optical filtering at step 90 with the laser configured as in FIGS. 6A, 6B, and 6C, respectively. The right portions show that the configuration of FIG. 6A where the center wavelength of the H peak is approximately centered on the center wavelength of the optical filter's pass band leads to filtered light of a larger integrated intensity than the configurations of FIGS. 6B-6C in which the center wavelength of the H peak is not centered on the center wavelength of the optical filter's pass band. For this reason, the wavelength-integrated intensity of the light beam produced by filtering at step 90 with an optical filter has maxima when the center wavelengths of the H peaks of the directly modulated lasers are aligned with the center wavelengths of pass bands of the optical filter. For that reason, each laser can be wavelength-locked to output light into a corresponding band pass of the optical filter used for optical filtering at the step 90 by adjusting the output wavelength of each laser to maximize its contribution to the measured intensities of the second sampling parts as estimated at the step 96.

In various embodiments, the steps of the method 80 of FIG. 5 may be repeated to approximately wavelength-lock N lasers to a set of preselected and corresponding output wavelengths.

In various embodiments, the improvement of amplitude optical extinction ratios and optical wavelength-locking may be performed together. For example, the systems 10A-10C and the subsystem 30 of FIG. 3 may optically filter the modulated optical carriers output by the lasers $12_1$-$12_N$ to both improve amplitude optical extinction ratios therein and obtain feedback for wavelength-locking the lasers $12_1$-$12_N$ to a preselected grid of wavelengths. For example, the systems 10A-10C and the subsystem 30 of FIG. 3 may be configured to perform both the method 70 of FIG. 4 and the method 80 of FIG. 5.

From the disclosure, drawings, and claims, other embodiments of the invention will be apparent to those skilled in the art.

What is claimed is:

1. An apparatus comprising:
an array of lasers, each of the lasers of the array being configured to produce light in a corresponding wavelength-channel, the wavelength-channels of different ones of the lasers being different;
an array of electrical drivers connected to directly modulate the lasers, each driver being configured to adjust a pumping current in the lasers by producing a first driving current or voltage to cause a corresponding one of the lasers to be in a first lasing state and by producing a different second driving current or voltage to cause the corresponding one of the lasers to be in a different second lasing state; and
an optical filter connected to receive light output by the lasers of the array; and
wherein the optical filter is configured to selectively attenuate light from each of the lasers in the first lasing states thereof and to selectively pass light from the each of the lasers in the second lasing states thereof, and
the wavelength-channels of the lasers have an average spacing, and the average wavelength-channel spacing is about equal to a positive integer multiple of a free spectral range of the optical filter.

2. The apparatus of claim 1, wherein the first driving current or voltage carries digital data received by the driver and the corresponding one of the lasers is in the first lasing state has light output that is amplitude or frequency modulated to carry the digital data, and, the different second driving current or voltage carries different digital data received by the driver and the corresponding one of the lasers in the different second lasing state has light output that is amplitude or frequency modulated to carry the different digital data.

3. The apparatus of claim 1, wherein the wavelength-channels of the lasers are tunable to lie on a fixed grid, the grid having an average wavelength-channel spacing that is about equal to a positive integer multiple of a free spectral range of the optical filter.

4. The apparatus of claim 1, wherein the average wavelength-channel spacing is equal to the free spectral range of the optical filter ±10 percent or less of the average wavelength-channel spacing.

5. The apparatus of claim 1, wherein the average spacing is equal the free spectral range of the optical filter ±10 percent or less of the average wavelength-channel spacing.

6. The apparatus of claim 1, wherein each laser outputs light having a first center wavelength in response to being directly modulated with a first digital data value and outputs light having a different second center wavelength in response to being directly modulated with a different second digital data value and the optical filter has a response that is at least 2decibels smaller at each second center wavelength than at the first center wavelength of the same laser.

7. The apparatus of claim 6 wherein the wavelength-channels of the lasers have an average wavelength-channel spacing, and the average wavelength-channel spacing is about equal to a positive integer multiple of a free spectral range of the optical filter.

8. The apparatus of claim 1, further comprising:
a first photo-detector configured to receive light being output by the lasers and not having passed through the optical filter; and
a second photo-detector configured to receive light being output by the lasers and having passed through the optical filter and having the average wavelength-channel spacing.

9. The apparatus of claim 8, further comprising a controller configured to adjust output wavelengths of the lasers with the average wavelength-channel spacing based on light intensity measurements of the first and second photo-detectors.

10. The apparatus of claim 8, wherein the apparatus is configured to dither each of the lasers.

11. The apparatus of claim 9, wherein the controller is configured to estimate relative contributions of individual ones of the lasers to the intensity of light measured by the second photo-detector.

12. The apparatus of claim 9, wherein the optical filter has a free spectral range that is equal to the average wavelength-channel spacing for the modulated light output by the array of the lasers ±10 percent or less of the average wavelength-channel spacing.

13. The apparatus of claim 11, wherein the controller is configured to adjust an output wavelength a particular one of the lasers by estimating a light intensity detected by the second photo-detector at a frequency of the dithering of the particular one of the lasers.

14. A method, comprising:
directly modulating a plurality of lasers including adjusting by producing driving currents or voltages such that each one of the lasers produces an optical carrier that is modulated to carry digital data in a wavelength-channel corresponding to the one of the lasers, the wavelength-channels being spaced apart by an average wavelength-channel spacing;
forming a multiplexed light beam by optically multiplexing the modulated optical carriers;
splitting the multiplexed light beam in a substantially wavelength-independent manner to form a first portion of the multiplexed light beam and a first part of the multiplexed light beam;
measuring an intensity of the first part of the multiplexed light without passing the first part through the optical filter;
optically filtering the first portion of the multiplexed light beam with an optical filter having a free spectral range, the average fixed wavelength-channel spacing being about equal to a positive integer multiple of the free spectral range; and
measuring an intensity of a second part of the filtered first portion of the multiplexed light, the second part being produced by splitting the filtered first portion into the second part and another portion of the filtered portion in a substantially wavelength-independent manner.

15. The method of claim 14, wherein each directly modulated laser lases with a corresponding first center wavelength when transmitting digital data of a first value and lases with a corresponding different second center wavelength when transmitting digital data of a different second value, the filtering attenuating light at the second center wavelength by at least 2decibels more than light at the first center wavelength.

16. The method of claim 14, wherein the first part of the multiplexed light is measured with a first photo-detector and the second part of the filtered first portion of the multiplexed light is measured with a second photo-detector, and
a controller adjusts output wavelengths of the lasers with the average wavelength-channel spacing based on light intensity measurements of the first and second photo-detectors.

17. The method of claim 16, further comprising adjusting output wavelengths of the lasers based on one or more of the measured intensities.

18. The method of claim 17, further comprising dithering output wavelengths of the lasers during the measuring acts.

19. The method of claim 18, wherein the adjusting the output wavelength of each individual one of the lasers includes estimating a contribution to the measured intensity of the second part at dithering frequency of the individual one of the lasers.

20. The method of claim 17, wherein each directly modulated laser lases with a corresponding first center wavelength when transmitting digital data of a first value and lases with a corresponding second center wavelength when transmitting digital data of a different second value, the filtering attenuating light at the second center wavelength by at least 2 decibels more than light at the first center wavelength.

21. The method of claim 16, wherein a free spectral range of the optical filter is equal to the average wavelength-channel spacing ±10 percent or less of the average wavelength-channel spacing.

22. An apparatus, comprising:
an array of lasers, each of the lasers of the array being configured to produce light in a corresponding wavelength-channel, the wavelength-channels of different ones of the lasers being different;
an array of electrical drivers connected to directly modulate the lasers, each driver being configured to adjust a pumping current in the lasers by producing a first driving current or voltage to cause a corresponding one of the lasers to be in a first lasing state and by producing a different second driving current or voltage to cause the corresponding one of the lasers to be in a different second lasing state; and
an optical filter connected to receive light output by the lasers of the array; and
wherein the optical filter is configured to selectively attenuate light from each of the lasers in the first lasing states thereof and to selectively pass light from the each of the lasers in the second lasing states thereof, and further comprising:
a first photo-detector configured to receive light being output by the lasers and not having passed through the optical filter; and
a second photo-detector configured to receive light being output by the lasers and having passed through the optical filter.

23. The apparatus of claim 22, wherein the wavelength-channels of the lasers have an average spacing, and the average wavelength-channel spacing is about equal to a positive integer multiple of a free spectral range of the optical filter.

24. The apparatus of claim 23, further including a controller configured, based on light intensity measurements of the first and second photo-detectors, to lock the output wavelengths of the lasers to have the average wavelength-channel spacing.

* * * * *